United States Patent [19]

Kim

[11] Patent Number: 5,240,581
[45] Date of Patent: Aug. 31, 1993

[54] METHOD OF PRODUCING A MAGNETO-OPTICAL DISK

[75] Inventor: Pil-Joong Kim, Seoul, Rep. of Korea

[73] Assignee: SKC Limited, Kyongi, Rep. of Korea

[21] Appl. No.: 844,850

[22] Filed: Mar. 3, 1992

[30] Foreign Application Priority Data

Mar. 5, 1991 [KR] Rep. of Korea ............... 91-3514

[51] Int. Cl.$^5$ ............................................. C23C 14/34
[52] U.S. Cl. ........................ 204/192.26; 204/192.16; 204/192.23
[58] Field of Search ........... 204/192.2, 192.22, 192.23, 204/192.26, 192.16

[56] References Cited

U.S. PATENT DOCUMENTS 4,948,482  8/1990  Kobayashi et al. .......... 204/192.23
4,959,136  9/1990  Hatwar ....................... 204/192.15

FOREIGN PATENT DOCUMENTS 1-78450  3/1989  Japan ......................... 204/192.26

Primary Examiner—Aaron Weisstuch
Attorney, Agent, or Firm—James D. Hall; Thomas J. Dodd

[57] ABSTRACT

Disclosed herein is a method of producing a magnetooptical disk by way of depositing a recording layer, a protective layer, and a reflection layer on a transparent substrate. The inventive method features that the refractive index of the protective layer is subjected to a precise control by way of changing the flow rate of argon gas within the range of no greater than 100 SCCM while maintaining the flow rate of nitrogen gas substantially constant at a value within the range of 3 to 10 SCCM.

3 Claims, 2 Drawing Sheets

METHOD OF PRODUCING A MAGNETO-OPTICAL DISK

FIELD OF THE INVENTION

The present invention relates to an improved method of producing a magneto-optical disk; and, more particularly, to a method of providing a protective layer of controlled refractive index on one side or opposite sides to the recording layer of the magneto-optical disk.

DESCRIPTION OF THE PRIOR ART

In general, optical recording media offer a number of benefits over conventional magnetic tapes or disks in that they have the ability to store data at a high recording density and good reliability for an extended period of service time. Examples of such optical recording media include a magneto-optical disk (MOD), a write once read many memory(WORM), a read only memory(ROM), and a compact disk(CD), all designed to store data/information in an optically readable condition. Of these, the magneto-optical disk is characterized by data erasability and rewritability, which renders it distinguishable over the remaining types of optical recording media.

Structurally, the magneto-optical disk comprises a transparent substrate on which a recording layer, a protective layer, and a reflection layer are sequentially deposited one above another. The protective layer that serves mainly to prevent the recording layer from oxidation may be provided on one side or opposite sides to the recording layer, although the latter is preferred in practice. Among the materials employed to form the protective layer are SiO, $SiO_2$, $Si_3N_4$, ZnS, and AlN, of which $Si_3N_4$ is most widely used due to its excellent chemical stability. Since the information recording and reproducing characteristics of the magneto-optical disk often vary with the refractive index of the protective layer, it is of paramount importance that the refractive index be under a strict control during the process of manufacturing the magneto-optical disk.

U.S. Pat. No. 4,782,477 discloses a method of forming a protective layer of $Si_3N_4$ or an adhesive layer of fluoroethylene on a transparent substrate through the use of a gas sputtering apparatus.

The patented method, however, fails to teach how to precisely control such process parameters as reaction gas flow rate, electric power level, and reaction pressure, rendering it difficult to obtain the protective layer with a consistent refractive index each time when the sputtering is carried out. This may result in the production of finished disks differing in their magneto-optical and thermo-magnetic characteristics from each other. Such an inconsistency in the disk characteristics often leads to a degradation of the recording and reproducing sensitivity, a decrease in the signal-to-noise ratio, and a so-called "jittering" by which it is meant an instantaneous swinging of the waveforms. In a nutshell, the patented method fails to disclose or suggest a process wherein the refractive index of the protective layer can be readily and precisely controlled to a desired value.

SUMMARY OF THE INVENTION

Accordingly, it is an object of the present invention to provide a method of producing magneto-optical disks which can substantially eliminate the prior art deficiencies encountered in controlling the refractive index of a protective layer and which is capable of controlling the refractive index to a predetermined value in a precise and convenient manner.

In accordance with the present invention, there is provided an improved method of producing a magneto-optical disk, said disk having a protective layer with a controlled refractive index, said protective layer being formed by way of positioning a target material in a sputter chamber and then subjecting the target material to a sputtering operation as argon gas and nitrogen gas are introduced into a sputter chamber, the improvement wherein said refractive index of the protective layer is controlled by changing the flow rate of said argon gas while maintaining the flow rate of said nitrogen gas substantially constant.

BRIEF DESCRIPTION OF THE DRAWINGS

The above and other objects and features of the present invention will become apparent from the following descriptions given in conjunction with the accompanying drawings, in which:

FIG. 1 is a partially enlarged sectional view showing a typical example of the prior art magneto-optical disk;

DETAILED DESCRIPTION OF THE PREFERRED EMBODIMENTS

Figure 2:
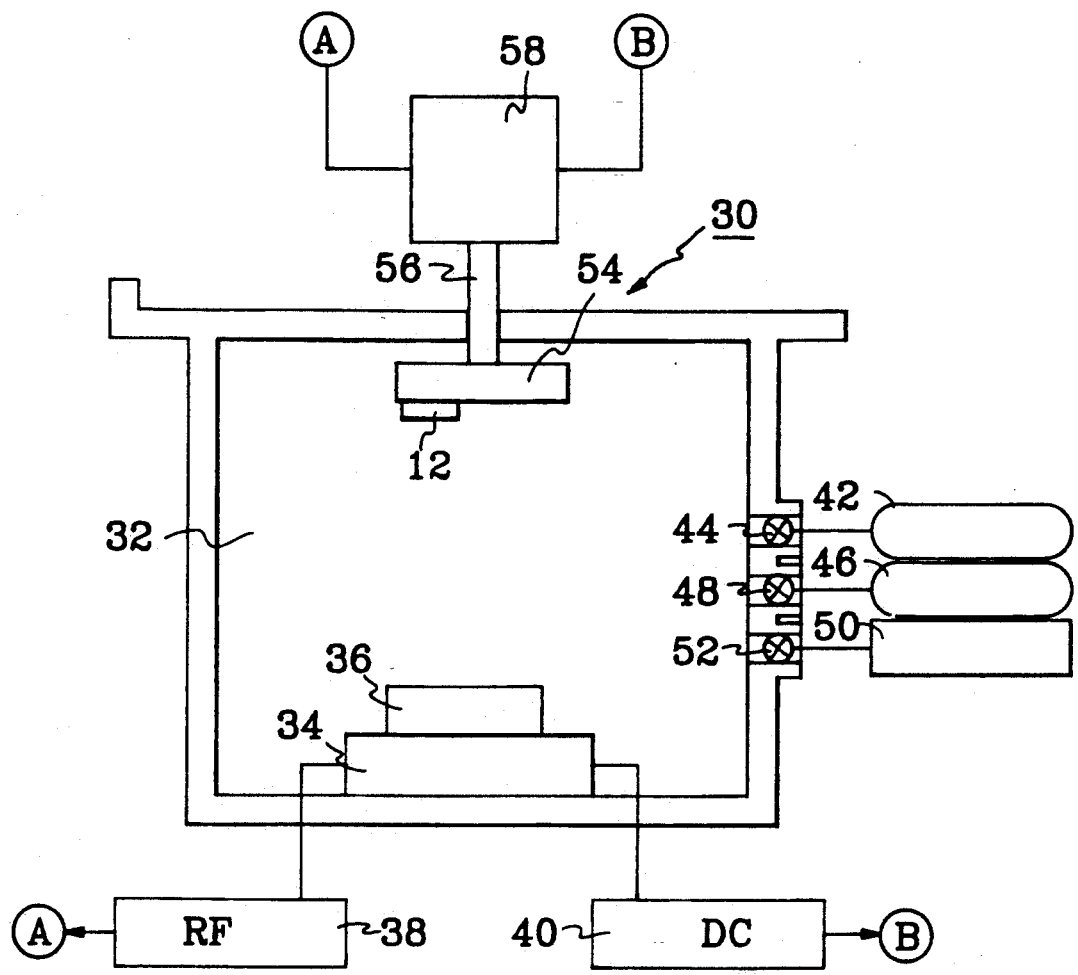
FIG. 2 is a schematic view showing a conventional sputtering apparatus for use in applying a variety of substance layers on the opposite sides of a transparent substrate.

Referring to FIG. 1, the disk 10 is shown to include a transparent substrate 12 that has a first, grooved surface and a second, light incident, flat surface opposite to the first surface. It is highly conventional that the substrate 12 can be molded through the use of a so-called stamper obtained from a known mastering process. The substrate 12 may be made of such transparent resin as polymethyl methacrylate, amorphous olefin, polycarbonate, epoxy, and the like. Deposited on the first surface of the substrate 12 are a first protective layer 14, a recording layer 16, a second protective layer 18, and a reflection layer 20, for instance. These layers may be sequentially formed one above another by a known dry process, e.g., sputtering or plasma polymerization. All but the reflection layer 20 are transparent so as to allow a light beam to pass therethrough. A curable resin layer 22 is deposited on the second surface of the transparent substrate 12 to help enhance the scratch-resistance of the substrate 12.

In depositing the layers on the opposite surfaces of the substrate, a conventional sputtering apparatus 30 may be utilized which is schematically shown in FIG. 2. The sputtering apparatus 30 is provided with a sputter chamber 32 that can house therein one or more magnetron sputter sources. FIG. 2 illustrates only one sputter source 34 for the sake of simplicity. Such a sputter source 34 is typically located on the floor of the sputter chamber 32 so as to hold a target material, e.g., a metal oxide target 36 in place. A radio frequency(RF) power supply 38 and a direct current (DC) power supply 40 are electrically connected to the sputter source 34 in a known manner. Provided on the side wall of the sputter chamber 32 are a nitrogen inlet port 44 through which nitrogen gas is fed from a nitrogen supply unit 42, an argon inlet port 48 through which argon gas is supplied from an argon supply unit 46, and an exhaust port 52 which is coupled to an exhaust unit 50. The sputter chamber 32 will be evacuated to a given pressure by the exhaust unit 50 before the nitrogen and argon gases are fed into the sputter chamber 32, as described below in more detail. The sputtering apparatus 30 is additionally provided with, at its top, a substrate holder 54 that serves to hold the substrate 12 in position. The holder 54 is operatively coupled to a drive unit 58 through a rotary shaft 56 which, in turn, is electrically connected to both the RF power supply 38 and the DC power supply 40.

The magneto-optical disk shown in FIG. 1 can be prepared through a sputtering process as set forth below. The substrate 12 is first attached to the holder 54 of the sputtering apparatus 30 so that the second, light incident surface thereof can face downward. A suitable target 36 is then placed on the sputter source 34 in a confronting relationship with the substrate 12. Subsequently, the exhaust unit 50 is driven to evacuate the sputter chamber 32 to a predetermined pressure, while introducing reaction gases, i.e., gaseous nitrogen and argon, into the sputter chamber 32 at different flow rates. As the holder 54 begins to rotate by the drive unit 58, RF or DC power is applied to the sputter source 34 so that the target 36 can be subjected to sputtering. Such sputtering process will continue until a silicon nitride layer, i.e. a first protective layer 14 of, e.g., 1,000 Angstroms in thickness is deposited on the second surface of the substrate 12. Once the formation of the first protective layer comes to an end, a succession of other layers, e.g., a recording layer 16, a second protective layer 18, a reflection layer 20, and other optional layers may be sequentially formed on the first protective layer 14 in a known manner. The second protective layer 18 is deposited in the same manner as set forth above in conjunction with the first protective layer 14, whereas the recording layer 16 and the reflection layer 20 may be formed by employing a conventional deposition technique. Finally, a curable resin layer 22 may be coated on the second surface of the substrate 12 to complete a mageneto-optical disk.

In accordance with the present invention, during the process of depositing the first or the second protective layer, it is desirable to maintain the electric power level and the reaction pressure approximately at 2 KW and $2 \times 10^{-3}$ Torr, respectively. This is partly to prevent an undue increase or decrease in the deposition speed of the protective layer, which may otherwise reduce the yield of the magneto-optical disk, and partly to facilitate controlling the refractive index of the protective layer by way of changing the argon gas flow rate alone.

Nitrogen gas is fed to the sputter chamber at a fixed flow rate within the range of 3 to 10 SCCM. In contrast, argon gas is supplied at varying flow rates but not more than 100 SCCM, dependent upon the desired refractive index of the protective layer. It is of importance that the nitrogen gas flow rate be so selected as not to saturate the protective layer with nitrogen. If the flow rate exceeds 10 SCCM, the protective layer will be saturated with nitrogen, thus making it impossible to control the refractive index. If the flow rate of nitrogen gas is less than 3 SCCM, the refractive index cannot be controlled by way of changing the flow rate of argon gas.

Description will now be given of Working Examples wherein a variety of protective layers are deposited in accordance with the present invention and Comparative Examples wherein the prior art deposition processes are made use of.

EXAMPLE 1

A transparent substrate made of silicon wafer was attached to the holder of the sputtering apparatus, with a silicon target placed on the sputter source. Evacuation was performed in order to drop the internal pressure of the sputter chamber to $2 \times 10^{-3}$ Torr, after which argon gas and nitrogen gas were introduced into the sputter chamber at the flow rates of 15 SCCM and 7 SCCM, respectively. The sputter chamber was reevacuated to $2 \times 10^{-7}$ Torr and, then, RF power of 2 KW was applied to the sputter source for a period of 10 minutes. As a result, a silicon nitride layer of 1,000 Angstroms in thickness was deposited on the silicon wafer substrate.

Measurement was made by Ellipsometer at the wavelength of 6328 Angstroms to determine the refractive index of the resulting protective layer. The refractive index in relation to the argon gas flow rate was plotted with a small circle on curve $E_{1-7}$ in FIG. 3.

EXAMPLES 2-7

Except that the argon gas flow rate was changed to 28, 55, 69, 81, 91 and 100 SCCM, the same procedure as in Example 1 was repeated to obtain six silicon nitride layers. An ellipsometer was used to measure the refractive indices for each of the silicon nitride layers. The refractive indices in relation to the argon gas flow rates were plotted with small circles on curve $E_{1-7}$ in FIG. 3.

EXAMPLES 8-14

Except that DC power was applied to the sputter source and that the argon gas flow rates were changed to 7, 21, 45, 61, 76, 87 and 92 SCCM, respectively, the same procedures as in Examples 1-7 were carried out to obtain seven silicon nitride layers, each being 1,000 Angstroms in thickness. An ellipsometer was used to measure the refractive indices for each of the silicon nitride layers. The refractive indices in relation to the argon gas flow rates were plotted with small circles on curve $E_{8-14}$ in FIG. 4.

COMPARATIVE EXAMPLES 1-7

Except that the argon gas flow rate was set to 75 SCCM and that the nitrogen gas flow rate was changed to 13, 14, 15, 17, 22, 26 and 32 SCCM, the same procedure as in Example 1 was performed to obtain seven silicon nitride layers. An ellipsometer was used to measure the refractive indices for each of the silicon nitride layers. The refractive indices in relation to the nitrogen gas flow rates were plotted with small triangles on curve $C_{1-7}$ in FIG. 3.

COMPARATIVE EXAMPLES 8-14

Except that DC power was applied to the sputter source and that the nitrogen gas flow rates were changed to 26, 27, 28, 30, 35, 40 and 45 SCCM, respectively, the same procedures as in comparative Examples 1-7 were carried out to obtain seven silicon nitride layers. An ellipsometer was used to measure the refractive indices for each of the silicon nitride layers. The refractive indices in relation to the nitrogen gas flow rates were plotted with small triangles on curve $C_{8-14}$ in FIG. 4.

Figure 3:
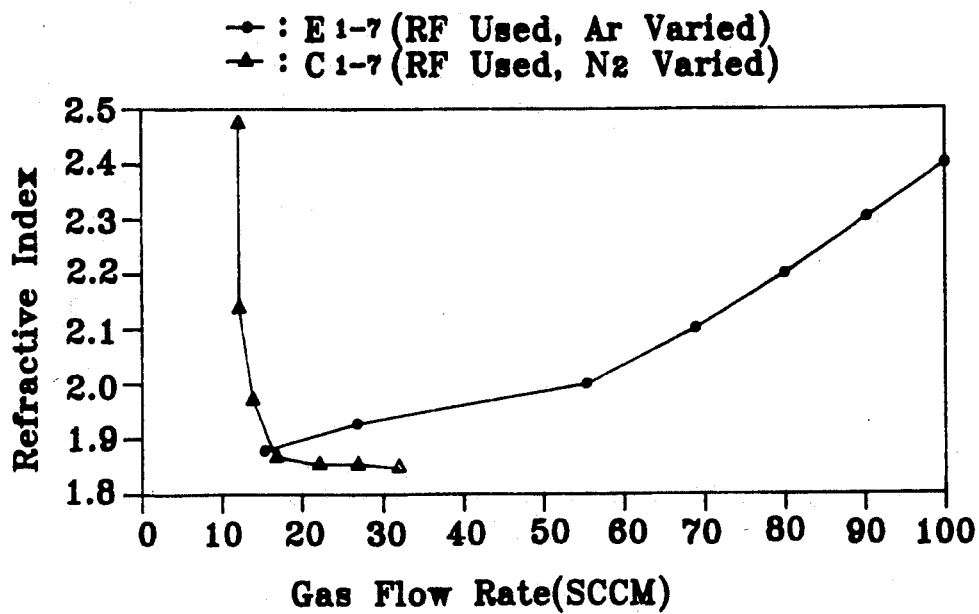
FIG. 3 is a graphical representation illustrating variations in the refractive indices of different protective layers, when a radio frequency(RF) power supply is used as a power source and when one of the flow rates of argon gas and nitrogen gas is increased, with the other being fixed to a given value.

It can be seen from FIG. 3 that the refractive indices of the silicon nitride layers are less sensitive to the change in the argon gas flow rates, in the case where the nitrogen gas flow rate is set to a predetermined value and a RF power supply is employed as the power source. In contrast, when the argon gas flow rate is set to a specific value, the refractive indices of the silicon nitride layers are highly sensitive to the change in the nitrogen gas flow rates, which means that it is extremely difficult to control the refractive index in a precise manner.

Figure 4:
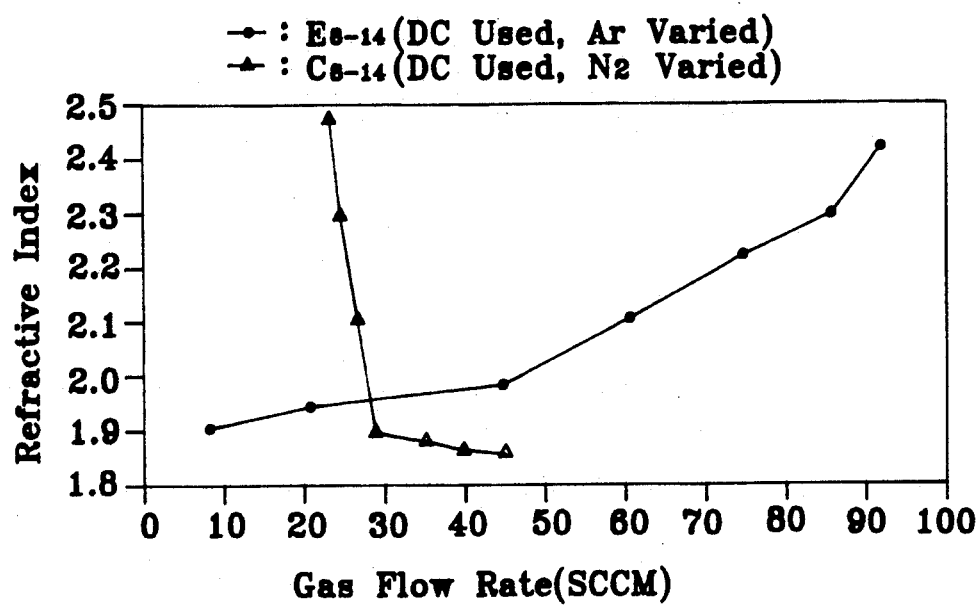
FIG. 4 is a view similar to FIG. 3 but illustrating variations in the refractive indices of the protective layer, when a direct current(DC) power source is employed in lieu of the RF power source.

As shown in FIG. 4, in the case where DC power is used in place of RF power, the refractive indices of the silicon nitride layers are also highly sensitive to the change in the nitrogen gas flow rates. As a separate matter, it has been found that RF power consumes more nitrogen gas and less argon gas than DC power in depositing a silicon nitride layer of specific refractive index.

Although this invention has been shown and described with respect to the preferred embodiments, it will be understood by those skilled in the art that certain changes and modifications may be made without departing from the spirit and scope of the invention as defined in the following claims.

What is claimed is:

1. In an improved method of producing a magneto-optical disk, said disk having a $Si_3N_4$ layer of a controlled refractive index, said $Si_3N_4$ layer formed by way of positioning a target material in a sputter chamber and then subjecting the target material to a sputtering operation as argon gas and nitrogen gas are introduced into the sputter chamber, the improvement which comprises controlling said refractive index of the $Si_3N_4$ layer by changing the flow rate of said argon gas, while maintaining the flow rate of said nitrogen gas substantially constant.

2. The method as recited in claim 1, wherein said argon gas flow rate varies within a range of 7 to 100 SCCM and said nitrogen gas flow rate is set to a predetermined value within a range of 3 to 10 SCCM.

3. The method as recited in claim 1, wherein said sputtering operation is carried out while the electric power and the reaction pressure are kept constant.

* * * * *